(12) United States Patent
Snyder et al.

(10) Patent No.: US 8,482,313 B2
(45) Date of Patent: *Jul. 9, 2013

(54) UNIVERSAL DIGITAL BLOCK INTERCONNECTION AND CHANNEL ROUTING

(75) Inventors: Warren Snyder, Snohomish, WA (US); Bert Sullam, Bellevue, WA (US); Haneef Mohammed, Beaverton, OR (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/099,334

(22) Filed: May 2, 2011

(65) Prior Publication Data

US 2011/0304354 A1  Dec. 15, 2011

Related U.S. Application Data

(63) Continuation of application No. 12/786,412, filed on May 24, 2010, now abandoned, which is a continuation of application No. 11/965,291, filed on Dec. 27, 2007, now Pat. No. 7,737,724.

(60) Provisional application No. 60/912,399, filed on Apr. 17, 2007.

(51) Int. Cl.
*H01L 25/00* (2006.01)
*H03K 19/177* (2006.01)

(52) U.S. Cl.
USPC .................................. 326/41; 326/39; 326/47

(58) Field of Classification Search
None
See application file for complete search history.

(56) References Cited

U.S. PATENT DOCUMENTS

| | | |
|---|---|---|
| 5,554,951 A | 9/1996 | Gough |
| 5,555,452 A | 9/1996 | Callaway et al. |
| 5,555,907 A | 9/1996 | Philipp |
| 5,557,762 A | 9/1996 | Okuaki et al. |
| 5,559,502 A | 9/1996 | Schutte |
| 5,559,996 A | 9/1996 | Fujioka |
| 5,563,526 A | 10/1996 | Hastings et al. |
| 5,563,529 A | 10/1996 | Seltzer et al. |
| 5,564,010 A | 10/1996 | Henry et al. |
| 5,564,108 A | 10/1996 | Hunsaker et al. |
| 5,565,658 A | 10/1996 | Gerpheide et al. |
| 5,566,702 A | 10/1996 | Philipp |
| 5,572,665 A | 11/1996 | Nakabayashi |
| 5,572,719 A | 11/1996 | Biesterfeldt |
| 5,574,678 A | 11/1996 | Gorecki |
| 5,574,852 A | 11/1996 | Bakker et al. |
| 5,574,892 A | 11/1996 | Christensen |

(Continued)

OTHER PUBLICATIONS

U.S. Appl. No. 11/322,044, mailed Dec. 28, 2005, Stiff, Jonathon.

(Continued)

*Primary Examiner* — Anh Tran

(57) ABSTRACT

A programmable routing scheme provides improved connectivity both between Universal Digital Blocks (UDBs) and between the UDBs and other micro-controller elements, peripherals and external Inputs and Outputs (I/Os) in the same Integrated Circuit (IC). The routing scheme increases the number of functions, flexibility, and the overall routing efficiency for programmable architectures. The UDBs can be grouped in pairs and share associated horizontal routing channels. Bidirectional horizontal and vertical segmentation elements extend routing both horizontally and vertically between different UDB pairs and to the other peripherals and I/O.

22 Claims, 9 Drawing Sheets

U.S. PATENT DOCUMENTS

| | | |
|---|---|---|
| 5,579,353 A | 11/1996 | Parmenter et al. |
| 5,587,945 A | 12/1996 | Lin et al. |
| 5,587,957 A | 12/1996 | Kowalczyk et al. |
| 5,590,354 A | 12/1996 | Klapproth et al. |
| 5,594,388 A | 1/1997 | O'Shaughnessy et al. |
| 5,594,734 A | 1/1997 | Worsley et al. |
| 5,594,876 A | 1/1997 | Getzlaff et al. |
| 5,594,890 A | 1/1997 | Yamaura et al. |
| 5,600,262 A | 2/1997 | Kolze |
| 5,604,466 A | 2/1997 | Dreps et al. |
| 5,608,892 A | 3/1997 | Wakerly |
| 5,614,861 A | 3/1997 | Harada |
| 5,617,041 A | 4/1997 | Lee et al. |
| 5,625,316 A | 4/1997 | Chambers et al. |
| 5,625,583 A | 4/1997 | Hyatt |
| 5,629,857 A | 5/1997 | Brennan |
| 5,629,891 A | 5/1997 | Lemoncheck et al. |
| 5,630,052 A | 5/1997 | Shah |
| 5,630,057 A | 5/1997 | Hait |
| 5,630,102 A | 5/1997 | Johnson et al. |
| 5,631,577 A | 5/1997 | Freidin et al. |
| 5,633,766 A | 5/1997 | Hase et al. |
| 5,642,295 A | 6/1997 | Smayling |
| 5,646,544 A | 7/1997 | Iadanza |
| 5,646,901 A | 7/1997 | Sharpe-Geisler et al. |
| 5,648,642 A | 7/1997 | Miller et al. |
| 5,651,035 A | 7/1997 | Tozun et al. |
| 5,652,893 A | 7/1997 | Ben-Meir et al. |
| 5,661,433 A | 8/1997 | LaRosa et al. |
| 5,663,900 A | 9/1997 | Bhandari et al. |
| 5,663,965 A | 9/1997 | Seymour |
| 5,664,199 A | 9/1997 | Kuwahara |
| 5,666,480 A | 9/1997 | Leung et al. |
| 5,670,915 A | 9/1997 | Cooper et al. |
| 5,673,198 A | 9/1997 | Lawman et al. |
| 5,675,825 A | 10/1997 | Dreyer et al. |
| 5,677,691 A | 10/1997 | Hosticka et al. |
| 5,680,070 A | 10/1997 | Anderson et al. |
| 5,682,032 A | 10/1997 | Philipp |
| 5,684,434 A | 11/1997 | Mann et al. |
| 5,684,952 A | 11/1997 | Stein |
| 5,686,844 A | 11/1997 | Hull et al. |
| 5,687,325 A | 11/1997 | Chang |
| 5,689,195 A | 11/1997 | Cliff et al. |
| 5,689,196 A | 11/1997 | Schutte |
| 5,691,664 A | 11/1997 | Anderson et al. |
| 5,691,898 A | 11/1997 | Rosenberg et al. |
| 5,694,063 A | 12/1997 | Burlison et al. |
| 5,696,952 A | 12/1997 | Pontarelli |
| 5,699,024 A | 12/1997 | Manlove et al. |
| 5,703,871 A | 12/1997 | Pope et al. |
| 5,706,453 A | 1/1998 | Cheng et al. |
| 5,708,589 A | 1/1998 | Beauvais |
| 5,708,798 A | 1/1998 | Lynch et al. |
| 5,710,906 A | 1/1998 | Ghosh et al. |
| 5,712,969 A | 1/1998 | Zimmermann et al. |
| 5,721,931 A | 2/1998 | Gephardt et al. |
| 5,724,009 A | 3/1998 | Collins et al. |
| 5,727,170 A | 3/1998 | Mitchell et al. |
| 5,728,933 A | 3/1998 | Schultz et al. |
| 5,729,704 A | 3/1998 | Stone et al. |
| 5,730,165 A | 3/1998 | Philipp |
| 5,732,277 A | 3/1998 | Kodosky et al. |
| 5,734,272 A | 3/1998 | Belot et al. |
| 5,734,334 A | 3/1998 | Hsieh et al. |
| 5,737,557 A | 4/1998 | Sullivan |
| 5,737,760 A | 4/1998 | Grimmer et al. |
| 5,745,011 A | 4/1998 | Scott |
| 5,748,048 A | 5/1998 | Moyal |
| 5,748,875 A | 5/1998 | Tzori |
| 5,752,013 A | 5/1998 | Christensen et al. |
| 5,754,552 A | 5/1998 | Allmond et al. |
| 5,754,826 A | 5/1998 | Gamal et al. |
| 5,757,368 A | 5/1998 | Gerpheide et al. |
| 5,758,058 A | 5/1998 | Milburn |
| 5,760,612 A | 6/1998 | Ramirez |
| 5,761,128 A | 6/1998 | Watanabe |
| 5,763,909 A | 6/1998 | Mead et al. |
| 5,764,714 A | 6/1998 | Stansell et al. |
| 5,767,457 A | 6/1998 | Gerpheide et al. |
| 5,774,704 A | 6/1998 | Williams |
| 5,777,399 A | 7/1998 | Shibuya |
| 5,781,030 A | 7/1998 | Agrawal et al. |
| 5,781,747 A | 7/1998 | Smith et al. |
| 5,784,545 A | 7/1998 | Anderson et al. |
| 5,790,882 A | 8/1998 | Silver et al. |
| 5,790,957 A | 8/1998 | Heidari |
| 5,796,183 A | 8/1998 | Hourmand et al. |
| 5,799,176 A | 8/1998 | Kapusta et al. |
| 5,801,958 A | 9/1998 | Dangelo et al. |
| 5,802,073 A | 9/1998 | Platt |
| 5,802,290 A | 9/1998 | Casselman |
| 5,805,792 A | 9/1998 | Swoboda et al. |
| 5,805,897 A | 9/1998 | Glowny |
| 5,808,883 A | 9/1998 | Hawkes |
| 5,811,987 A | 9/1998 | Ashmore, Jr. et al. |
| 5,812,698 A | 9/1998 | Platt et al. |
| 5,818,254 A | 10/1998 | Agrawal et al. |
| 5,818,444 A | 10/1998 | Alimpich et al. |
| 5,818,736 A | 10/1998 | Leibold |
| 5,819,028 A | 10/1998 | Manghirmalani et al. |
| 5,822,387 A | 10/1998 | Mar |
| 5,822,531 A | 10/1998 | Gorczyca et al. |
| 5,828,693 A | 10/1998 | Mays et al. |
| 5,838,583 A | 11/1998 | Varadarajan et al. |
| 5,841,078 A | 11/1998 | Miller et al. |
| 5,841,996 A | 11/1998 | Nolan et al. |
| 5,844,256 A | 12/1998 | Mead et al. |
| 5,844,404 A | 12/1998 | Caser et al. |
| 5,848,285 A | 12/1998 | Kapusta et al. |
| 5,850,156 A | 12/1998 | Wittman |
| 5,852,733 A | 12/1998 | Chien et al. |
| 5,854,625 A | 12/1998 | Frisch et al. |
| 5,857,109 A | 1/1999 | Taylor |
| 5,861,583 A | 1/1999 | Schediwy et al. |
| 5,861,875 A | 1/1999 | Gerpheide |
| 5,864,242 A | 1/1999 | Allen et al. |
| 5,864,392 A | 1/1999 | Winklhofer et al. |
| 5,867,046 A | 2/1999 | Sugasawa |
| 5,867,399 A | 2/1999 | Rostoker et al. |
| 5,869,979 A | 2/1999 | Bocchino |
| 5,870,004 A | 2/1999 | Lu |
| 5,870,309 A | 2/1999 | Lawman |
| 5,870,345 A | 2/1999 | Stecker |
| 5,872,464 A | 2/1999 | Gradinariu |
| 5,874,958 A | 2/1999 | Ludolph |
| 5,875,293 A | 2/1999 | Bell et al. |
| 5,877,656 A | 3/1999 | Mann et al. |
| 5,878,425 A | 3/1999 | Redpath |
| 5,880,411 A | 3/1999 | Gillespie et al. |
| 5,880,598 A | 3/1999 | Duong |
| 5,883,623 A | 3/1999 | Cseri |
| 5,886,582 A | 3/1999 | Stansell |
| 5,887,189 A | 3/1999 | Birns et al. |
| 5,889,236 A | 3/1999 | Gillespie et al. |
| 5,889,723 A | 3/1999 | Pascucci |
| 5,889,936 A | 3/1999 | Chan |
| 5,889,988 A | 3/1999 | Held |
| 5,894,226 A | 4/1999 | Koyama |
| 5,894,243 A | 4/1999 | Hwang |
| 5,894,565 A | 4/1999 | Furtek et al. |
| 5,895,494 A | 4/1999 | Scalzi et al. |
| 5,896,068 A | 4/1999 | Moyal |
| 5,896,330 A | 4/1999 | Gibson |
| 5,898,345 A | 4/1999 | Namura et al. |
| 5,900,780 A | 5/1999 | Hirose et al. |
| 5,901,062 A | 5/1999 | Burch et al. |
| 5,903,718 A | 5/1999 | Marik |
| 5,905,398 A | 5/1999 | Todsen et al. |
| 5,909,544 A | 6/1999 | Anderson et al. |
| 5,911,059 A | 6/1999 | Profit, Jr. |
| 5,914,465 A | 6/1999 | Allen et al. |
| 5,914,633 A | 6/1999 | Comino et al. |
| 5,914,708 A | 6/1999 | LaGrange et al. |
| 5,917,356 A | 6/1999 | Casal et al. |
| 5,920,310 A | 7/1999 | Faggin et al. |
| 5,923,264 A | 7/1999 | Lavelle et al. |

| | | | | | | |
|---|---|---|---|---|---|---|
| 5,926,566 A | 7/1999 | Wang et al. | | 6,043,719 A | 3/2000 | Lin et al. |
| 5,929,710 A | 7/1999 | Bien | | 6,049,223 A | 4/2000 | Lytle et al. |
| 5,930,148 A | 7/1999 | Bjorksten et al. | | 6,049,225 A | 4/2000 | Huang et al. |
| 5,930,150 A | 7/1999 | Cohen et al. | | 6,051,772 A | 4/2000 | Cameron et al. |
| 5,931,959 A | 8/1999 | Kwiat | | 6,052,035 A | 4/2000 | Nolan et al. |
| 5,933,023 A | 8/1999 | Young | | 6,052,524 A | 4/2000 | Pauna |
| 5,933,356 A | 8/1999 | Rostoker et al. | | 6,055,584 A | 4/2000 | Bridges et al. |
| 5,933,816 A | 8/1999 | Zeanah et al. | | 6,057,705 A | 5/2000 | Wojewoda et al. |
| 5,935,233 A | 8/1999 | Jeddeloh | | 6,058,263 A | 5/2000 | Voth |
| 5,935,266 A | 8/1999 | Thurnhofer et al. | | 6,058,452 A | 5/2000 | Rangasayee et al. |
| 5,939,904 A | 8/1999 | Fetterman et al. | | 6,061,511 A | 5/2000 | Marantz et al. |
| 5,939,949 A | 8/1999 | Olgaard et al. | | 6,066,961 A | 5/2000 | Lee et al. |
| 5,941,991 A | 8/1999 | Kageshima | | 6,070,003 A | 5/2000 | Gove et al. |
| 5,942,733 A | 8/1999 | Allen et al. | | 6,072,803 A | 6/2000 | Allmond et al. |
| 5,943,052 A | 8/1999 | Allen et al. | | 6,075,941 A | 6/2000 | Itoh et al. |
| 5,945,878 A | 8/1999 | Westwick et al. | | 6,079,985 A | 6/2000 | Wohl et al. |
| 5,949,632 A | 9/1999 | Barreras, Sr. et al. | | 6,081,140 A | 6/2000 | King |
| 5,952,888 A | 9/1999 | Scott | | 6,094,730 A | 7/2000 | Lopez et al. |
| 5,956,279 A | 9/1999 | Mo et al. | | 6,097,211 A | 8/2000 | Couts-Martin et al. |
| 5,959,871 A | 9/1999 | Pierzchala et al. | | 6,097,432 A | 8/2000 | Mead et al. |
| 5,963,075 A | 10/1999 | Hiiragizawa | | 6,101,457 A | 8/2000 | Barch et al. |
| 5,963,105 A | 10/1999 | Nguyen | | 6,101,617 A | 8/2000 | Burckhartt et al. |
| 5,963,503 A | 10/1999 | Lee | | 6,104,217 A | 8/2000 | Magana |
| 5,964,893 A | 10/1999 | Circello et al. | | 6,104,325 A | 8/2000 | Liaw et al. |
| 5,966,027 A | 10/1999 | Kapusta et al. | | 6,107,769 A | 8/2000 | Saylor et al. |
| 5,966,532 A | 10/1999 | McDonald et al. | | 6,107,826 A | 8/2000 | Young et al. |
| 5,968,135 A | 10/1999 | Teramoto et al. | | 6,107,882 A | 8/2000 | Gabara et al. |
| 5,969,513 A | 10/1999 | Clark | | 6,110,223 A | 8/2000 | Southgate et al. |
| 5,969,632 A | 10/1999 | Diamant et al. | | 6,111,431 A | 8/2000 | Estrada |
| 5,973,368 A | 10/1999 | Pearce et al. | | 6,112,264 A | 8/2000 | Beasley et al. |
| 5,974,235 A | 10/1999 | Nunally et al. | | 6,121,791 A | 9/2000 | Abbott |
| 5,977,791 A | 11/1999 | Veenstra | | 6,121,805 A | 9/2000 | Thamsirianunt et al. |
| 5,978,584 A | 11/1999 | Nishibata et al. | | 6,121,965 A | 9/2000 | Kenney et al. |
| 5,978,937 A | 11/1999 | Miyamori et al. | | 6,121,971 A | 9/2000 | Berry et al. |
| 5,982,105 A | 11/1999 | Masters | | 6,125,416 A | 9/2000 | Warren |
| 5,982,229 A | 11/1999 | Wong et al. | | 6,130,548 A | 10/2000 | Koifman |
| 5,982,241 A | 11/1999 | Nguyen et al. | | 6,130,551 A | 10/2000 | Agrawal et al. |
| 5,983,277 A | 11/1999 | Heile et al. | | 6,130,552 A | 10/2000 | Jefferson et al. |
| 5,986,479 A | 11/1999 | Mohan | | 6,130,553 A | 10/2000 | Nakaya |
| 5,987,246 A | 11/1999 | Thomsen et al. | | 6,133,773 A | 10/2000 | Garlepp et al. |
| 5,988,902 A | 11/1999 | Holehan | | 6,134,181 A | 10/2000 | Landry |
| 5,994,939 A | 11/1999 | Johnson et al. | | 6,134,516 A | 10/2000 | Wang et al. |
| 5,996,032 A | 11/1999 | Baker | | 6,137,308 A | 10/2000 | Nayak |
| 5,999,725 A | 12/1999 | Barbier et al. | | 6,140,853 A | 10/2000 | Lo |
| 6,002,268 A | 12/1999 | Sasaki et al. | | 6,141,376 A | 10/2000 | Shaw |
| 6,002,398 A | 12/1999 | Wilson | | 6,141,764 A | 10/2000 | Ezell |
| 6,003,054 A | 12/1999 | Oshima et al. | | 6,144,327 A | 11/2000 | Distinti et al. |
| 6,003,107 A | 12/1999 | Ranson et al. | | 6,148,104 A | 11/2000 | Wang et al. |
| 6,003,133 A | 12/1999 | Moughanni et al. | | 6,215,326 B1 * | 4/2001 | Jefferson et al. ................. 326/41 |
| 6,005,814 A | 12/1999 | Mulholland et al. | | 7,274,212 B1 * | 9/2007 | Burney et al. ................... 326/39 |
| 6,005,904 A | 12/1999 | Knapp et al. | | 7,389,487 B1 * | 6/2008 | Chan et al. ..................... 716/50 |
| 6,006,321 A | 12/1999 | Abbott | | 7,737,724 B2 * | 6/2010 | Snyder et al. ................... 326/41 |
| 6,006,322 A | 12/1999 | Muramatsu | | 8,026,739 B2 | 9/2011 | Sullam et al. |
| 6,008,685 A | 12/1999 | Kunst | | 2001/0000634 A1 | 5/2001 | Keehn et al. |
| 6,008,703 A | 12/1999 | Perrott et al. | | 2001/0002129 A1 | 5/2001 | Zimmerman et al. |
| 6,009,270 A | 12/1999 | Mann | | 2001/0006347 A1 | 7/2001 | Jefferson et al. |
| 6,009,496 A | 12/1999 | Tsai | | 2001/0010083 A1 | 7/2001 | Satoh |
| 6,011,407 A | 1/2000 | New | | 2001/0038392 A1 | 11/2001 | Humpleman et al. |
| 6,012,835 A | 1/2000 | Thompson et al. | | 2001/0043081 A1 | 11/2001 | Rees |
| 6,014,135 A | 1/2000 | Fernandes | | 2001/0044927 A1 | 11/2001 | Karniewicz |
| 6,014,509 A | 1/2000 | Furtek et al. | | 2001/0045861 A1 | 11/2001 | Bloodworth et al. |
| 6,014,723 A | 1/2000 | Tremblay et al. | | 2001/0047509 A1 | 11/2001 | Mason et al. |
| 6,016,554 A | 1/2000 | Skrovan et al. | | 2002/0010716 A1 | 1/2002 | McCartney et al. |
| 6,016,563 A | 1/2000 | Fleisher | | 2002/0016706 A1 | 2/2002 | Cooke et al. |
| 6,018,559 A * | 1/2000 | Azegami et al. ................. 377/79 | | 2002/0023110 A1 | 2/2002 | Fortin et al. |
| 6,023,422 A | 2/2000 | Allen et al. | | 2002/0042696 A1 | 4/2002 | Garcia et al. |
| 6,023,565 A | 2/2000 | Lawman et al. | | 2002/0052729 A1 | 5/2002 | Kyung et al. |
| 6,026,134 A | 2/2000 | Duffy et al. | | 2002/0059543 A1 | 5/2002 | Cheng et al. |
| 6,026,501 A | 2/2000 | Hohl et al. | | 2002/0063688 A1 | 5/2002 | Shaw et al. |
| 6,028,271 A | 2/2000 | Gillespie et al. | | 2002/0065646 A1 | 5/2002 | Waldie et al. |
| 6,028,959 A | 2/2000 | Wang et al. | | 2002/0068989 A1 | 6/2002 | Ebisawa et al. |
| 6,031,365 A | 2/2000 | Sharpe-Geisler | | 2002/0073119 A1 | 6/2002 | Richard |
| 6,032,268 A | 2/2000 | Swoboda et al. | | 2002/0073380 A1 | 6/2002 | Cooke et al. |
| 6,034,538 A | 3/2000 | Abramovici | | 2002/0080186 A1 | 6/2002 | Frederiksen |
| 6,035,320 A | 3/2000 | Kiriaki et al. | | 2002/0085020 A1 | 7/2002 | Carroll |
| 6,037,807 A | 3/2000 | Wu et al. | | 2002/0099863 A1 | 7/2002 | Comeau et al. |
| 6,038,551 A | 3/2000 | Barlow et al. | | 2002/0109722 A1 | 8/2002 | Rogers et al. |
| 6,041,406 A | 3/2000 | Mann | | 2002/0116168 A1 | 8/2002 | Kim |
| 6,043,695 A | 3/2000 | O'Sullivan | | 2002/0121679 A1 | 9/2002 | Bazarjani et al. |

| | | | |
|---|---|---|---|
| 2002/0122060 | A1 | 9/2002 | Markel |
| 2002/0129334 | A1 | 9/2002 | Dane et al. |
| 2002/0133771 | A1 | 9/2002 | Barnett |
| 2002/0133794 | A1 | 9/2002 | Kanapathippillai et al. |
| 2002/0138516 | A1 | 9/2002 | Igra |
| 2002/0144099 | A1 | 10/2002 | Muro et al. |
| 2002/0145433 | A1 | 10/2002 | Morrise et al. |
| 2002/0152234 | A1 | 10/2002 | Estrada et al. |
| 2002/0152449 | A1 | 10/2002 | Lin |
| 2002/0156885 | A1 | 10/2002 | Thakkar |
| 2002/0156998 | A1 | 10/2002 | Casselman |
| 2002/0161802 | A1 | 10/2002 | Gabrick et al. |
| 2002/0166100 | A1 | 11/2002 | Meding |
| 2002/0174134 | A1 | 11/2002 | Goykhman |
| 2002/0174411 | A1 | 11/2002 | Feng et al. |
| 2002/0191029 | A1 | 12/2002 | Gillespie et al. |
| 2008/0263319 | A1 | 10/2008 | Snyder et al. |
| 2008/0263334 | A1 | 10/2008 | Synder et al. |
| 2008/0288755 | A1 | 11/2008 | Synder et al. |
| 2008/0294806 | A1 | 11/2008 | Swindle et al. |

OTHER PUBLICATIONS

U.S. Appl. No. 12/060,176 "Programmable System-On-Chip Hub," Scott Allen Swindle et al., filed Mar. 31, 2008; 39 pages.

U.S. Appl. No. 12/104,391 "Clock Driven Dynamic Datapath Chaining," Warren Synder et al., filed Apr. 16, 2008; 31 pages.

U.S. Appl. No. 12/356,468 "System and Method for Dynamically Generating a Configuration Datasheet," Anderson et al.; filed Jan. 20, 2009; 27 pages.

U.S. Appl. No. 12/765,400 "Autonomous Control in a Programmable System," Sullam et al., filed Apr. 22, 2010; 30 pages.

U.S. Appl. No. 12/786,412 "Universal Digital Block Interconnection and Channel Routing," Warren Snyder et al., filed May 24, 2010; 31 pages.

Application No. 2008800122321 "Universal Digital Block Interconnection and Channel Routing," Warren S. Snyder et al., filed Apr. 17, 2008.

Application No. PCT/US08/60673 "Clock Driven Dynamic Datapath Chaining," filed Apr. 17, 2008; 24 pages.

Application No. PCT/US08/60680 "Universal Digital Block Interconnection and Channel Routing," filed Apr. 17, 2008; 25 pages.

Application No. PCT/US08/60685 "Universal Digital Block With Integrated Arithmetic Logic Unit," filed Apr. 17, 2008; 24 pages.

Application No. PCT/US08/60686 "Programmable System-On-Chip Hub," filed Apr. 17, 2008; 22 pages.

Application No. PCT/US08/60695 "System Level Interconnect With Programmable Switching," filed Apr. 17, 2008; 4 pages.

Application No. PCT/US08/60696 "Dynamically Configurable and Re-Configurable Data Path," filed Apr. 17, 2008; 29 pages.

Ashok Bindra, "Programmable SoC Delivers a New Level of System Flexibility"; Electronic Design; Nov. 6, 2000; 11 pages.

Atmel Corporation: AT9OSC Summary: "Secure Microcontrollers for Smart Cards," Oct. 1999; 7 pages.

Azim et al., "A Custom DSP Chip to Implement a Robot Motion Controller Proceedings of the IEEE Custom Integrated Circuits Conference," May 1988, pp. 8.7.1-8.7.5; 6 pages.

Bakker et al., "Micropower CMOS Temperature Sensor with Digital Output," IEEE Journal of Solid-State Circuits, Jul. 1996; 3 pages.

Balough et al., "White Paper: Comparing IP Integration Approaches for FPGA Implementation," Feb. 2007, Version 1.1, Altera, pp. 1-7; 7 pages.

Bauer et al.; "A Reconfigurable Logic Machine for Fast Event-Driven Simulation"; Jun. 1998; Design Automation Conference Proceedings; 8 pages.

Burogs et al., "Power Converter Analysis and Design using Matlab: A Transfer Function Approach," Proceedings of IEEE International Symposium on Industrial Electronics 1998, vol. 2, pp. 552-557; 6 pages.

Bursky, "FPGA Combines Multiple Interfaces and Logic," Electronic Design, vol. 48 No. 20, Oct. 2, 2000, pp. 74-78; 5 pages.

Catthoor et al., "Architectural Strategies for an Application-Specific Synchronous Multiprocessor Environment," IEEE transactions on Acoustics, Speech, and Signal Processing; vol. 36, No. 2, Feb. 1988, pp. 265-284; 20 pages.

USPTO Final Rejection for U.S. Appl. No. 12/060,176 dated Jun. 21, 2012; 26 pages.

Chapweske, Adam; "The PS/2 Mouse Interface," PS/2 Mouse Interfacing, 2001, retrieved on May 18, 2006; 11 pages.

Charles Melear, "Using Background Modes for Testing, Debugging and Emulation of Microcontrollers," IEEE, 1997, pp. 90-97; 8 pages.

Charles, Jr. et al., "Wirebonding: Reinventing the Process for MCMs," Apr. 1998, IEEE 7th International Conference on Multichip Modules and High Density Packaging, pp. 300-302; 3 pages.

Ching et al., "An In-Circuit-Emulator for TMS320C25," IEEE, 1994, pp. 51-56; 6 pages.

Cover Pages Technology Reports; XML and Electronic Design Automation (EDA); Aug. 2000; retrieved from http://xml.coverpages.org on Mar. 23, 2005; 5 pages.

Cypress MicroSystem, Inc. "Cypress Customer Forums" retrieved from <http://www.cypress.com/forums/messageview>; Nov. 30, 2004; 1 page.

Cypress MicroSystem, Inc. "PsoC Designer: Integrated Development Environment User Guide"; Rev. 1.18; Sep. 8, 2003; 193 pages.

Cypress MicroSystems, Inc. "Cypress MicroSystems Unveils Programmable System-On-A-Chip for Embedded Internet, Communications, and Consumer Systems" Nov. 13, 2000; 3 pages.

Cypress Semiconductor Corporation, "CY8C21x34 Data Sheet," CSR User Module, CSR V.1.0; Oct. 6, 2005; 36 pages.

Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.

Cypress Semiconductor Corporation, "FAN Controller CG6457AM and CG6462AM," PSoC Mixed Signal Array Preliminary Data Sheet; May 24, 2005; 25 pages.

Cypress Semiconductor Corporation, "PSoC CY8C20x34 Technical Reference Manual (TRM)," PSoC CY8C20x34 TRM, Version 1.0, 2006; 218 pages.

Cypress Semiconductor Corporation, "PSoC Mixed-Signal Controllers," Production Description; <http://www.cypress.com/portal/server>; retrieved on Sep. 27, 2005; 2 pages.

Cypress Semiconductor Corporation, "Release Notes srn017," Jan. 24, 2007; 3 pages.

Dahl et al., "Emulation of the Sparcle Microprocessor with the MIT Virtual Wires Emulation System," 1994, IEEE, pp. 14-22; 9 pages.

Daniel B. Sedory, "A Guide to DEBUG," 2004, retrieved on May 20, 2005 from http://www.geocites.com/thestarman3/asm/debug/debug2.htm, pp. 1-11; 7 pages.

Dirk Killat, "A One-Chip Solution for Electronic Ballasts in Fluorescent Lamps," Power Electronics, http://powerelectronics.com/mag/power_onechip_solution_electronic/, dated Mar. 1, 2004, accessed Sep. 13, 2005; 4 pages.

Durham et al., "Circuit Architectures for High Linearity Monolithic Continuous-Time Filtering," IEEE, 1992; 7 pages.

Durham et al., "High-Linearity Conitnuous-Time Filter in 5-V VLSI CMOS," IEEE, 1992; 8 pages.

Durham et al., "Integrated Continuous-Time Balanced Filters for 16-bit DSP Interfaces," IEEE, 1993; 6 pages.

Duvvuru et al., "Evaluation of a Branch Target Address Cache," 1995, IEEE, pp. 173-180; 8 pages.

Ebeling et al., "Validating VLSI Circuit Layout by Wirelist Comparison," Sep. 1983, In the Proceedings of the IEEE International Conference on Computer Aided Design (ICCAD-83), pp. 172-173; 2 pages.

Ebling, "Gemini II: A Second Generation Layout Validation Program;" 1988; in proceedings of the IEEE International Conference on Computer Aided Design (ICCAD-88); 4 pages.

Efstathiou, "Analog Electronics: Basic Circuits of Operational Amplifiers," <http://web.archive.org/web/20021231045232> Dec. 31, 2002, version, retrieved from the Internet Archives; 10 pages.

Electronic Tools Company; E-Studio User Manuel; 2000; retrieved from http://web.archive.org for site http://e-tools.com on Mar. 23, 2005; 77 pages.

Frank Goodenough, "Analog Counterparts of FPGAS Ease System Design," Electronic Design, Penton Publishing, Cleveland, OH, Oct. 14, 1994, vol. 42, No. 21, pp. 63-66, 68; 10 pages.

Fred Eady, "PSoC 101," Circuit Cellar, Aug. 2004, accessed Sep. 13, 2005, http://www.circuitcellar.com/library/print/0804/eady169/2.htm; 4 pages.

From U.S. Appl. No. 10/033,027; "Programmable Microcontroller (PSoC) Architecture (Mixed Analog/Digital)"; Aug. 7, 2001; U.S. Appl. No. 09/924,734 Snyder et al.; 28 pages.

* cited by examiner

UNIVERSAL DIGITAL BLOCK INTERCONNECTION AND CHANNEL ROUTING

The present application is a continuation of U.S. application Ser. No. 12/786,412 which claims priority U.S. Non Provisional application Ser. No. 11/965,291 filed Dec. 27, 2007, now U.S. Pat. No. 7,737,724 issued on Jun. 15, 2010 and U.S. Provisional Application No. 60/912,399 filed on Apr. 17, 2007 all of which are incorporated herein by reference.

TECHNICAL FIELD

The present disclosure relates generally to programmable devices, and more particularly to a programmable interconnect matrix.

BACKGROUND

Field-programmable gate arrays (FPGAs) and Programmable Logic Devices (PLDs) have been used in data communication and telecommunication systems. Conventional PLDs and FPGAs consist of an array of programmable elements, with the elements programmed to implement a fixed function or equation. Some currently-available Complex PLD (CPLD) products comprise arrays of logic cells. Conventional PLD devices have several drawbacks, such as limited speed and limited data processing capabilities.

In developing complex integrated circuits, there is often a need for additional peripheral units, such as operational and instrument amplifiers, filters, timers, digital logic circuits, analog to digital and digital to analog converters, etc. As a general rule, implementation of these extra peripherals create additional difficulties: extra space for new components, additional attention during production of a printed circuit board, and increased power consumption. All of these factors can significantly affect the price and development cycle of the project.

The introduction of the Programmable System on Chip (PSoC) features digital and analog programmable blocks, which allow the implementation of a large number of peripherals. A programmable interconnect allows analog and digital blocks to be combined to form a wide variety of functional modules. The digital blocks consist of smaller programmable blocks and are configured to provide different digital functions. The analog blocks are used for development of analog elements, such as analog filters, comparators, inverting amplifiers, as well as analog to digital and digital to analog converters. Current PSoC architectures provide only a coarse grained programmability where only a few fixed functions are available with only a small number of connection options.

SUMMARY

A programmable interconnect matrix includes horizontal channels that programmably couple different groups of one or more digital blocks together. The interconnect matrix can include segmentation elements that programmably interconnect different horizontal channels together. The segmentation elements can include horizontal segmentation switches that programmably couple together the horizontal channels for different groups of digital blocks in a same row. Vertical segmentation switches can programmably couple together the horizontal channels for different groups of digital blocks in different rows.

Vertical channels can programmably connect the horizontal channels in different rows. The horizontal channels provide more connectivity between the digital blocks located in the same rows than connectivity provided by the vertical channels connecting the digital blocks in different rows. Two digital blocks in a same digital block pair can be tightly coupled together to common routes in a same associated horizontal channel and different digital block pairs can be less tightly coupled together through the segmentation elements.

Programmable switches are configured to connect different selectable signals from the digital bocks to their associated horizontal channels. Programmable tri-state buffers in the segmentation elements can be configured to selectively couple together and drive signals between different horizontal channels.

A Random Access Memory (RAM) can be configured to programmably control how the different digital blocks are coupled together through the interconnection matrix. Undedicated Inputs and Outputs (I/Os) can be programmably coupled to different selectable signals in different selectable digital blocks through different selectable routes in the interconnection matrix. The undedicated Inputs and Outputs refer to the connections on the Integrated Circuit (IC) to external signals.

A micro-controller system is programmably coupled to the different digital blocks through the interconnect matrix and is programmably coupled to the different programmable Inputs/Outputs (I/Os) through the interconnect matrix. The micro-controller system can include a micro-controller, an interrupt controller, and Direct Memory Access (DMA) controller. Interrupt requests can be programmably coupled between the interrupt controller and different selectable digital blocks or different selectable I/Os through the interconnect matrix. DMA requests can also be programmably coupled between the DMA controller and different selectable digital blocks or different selectable I/Os through the interconnect matrix. In one embodiment, the micro-controller, digital blocks, I/Os, and interconnect are all located in a same integrated circuit.

In one embodiment, the digital blocks comprise a first group of uncommitted logic elements that are programmable into different logic functions and also include a second group of structural logic elements that together form a programmable arithmetic sequencer.

INTRODUCTION

A new programmable routing scheme provides improved connectivity both between Universal Digital Blocks (UDBs) and between the UDBs and other micro-controller elements, peripherals and external Inputs and Outputs (I/Os) in the same Integrated Circuit (IC). The routing scheme increases the number of functions and the overall routing efficiency for programmable architectures. The UDBs can be grouped in pairs and share associated horizontal routing channels. Bidirectional horizontal and vertical segmentation elements extend routing both horizontally and vertically between different UDB pairs and to the other peripherals and I/O.

DETAILED DESCRIPTION

Figure 1:
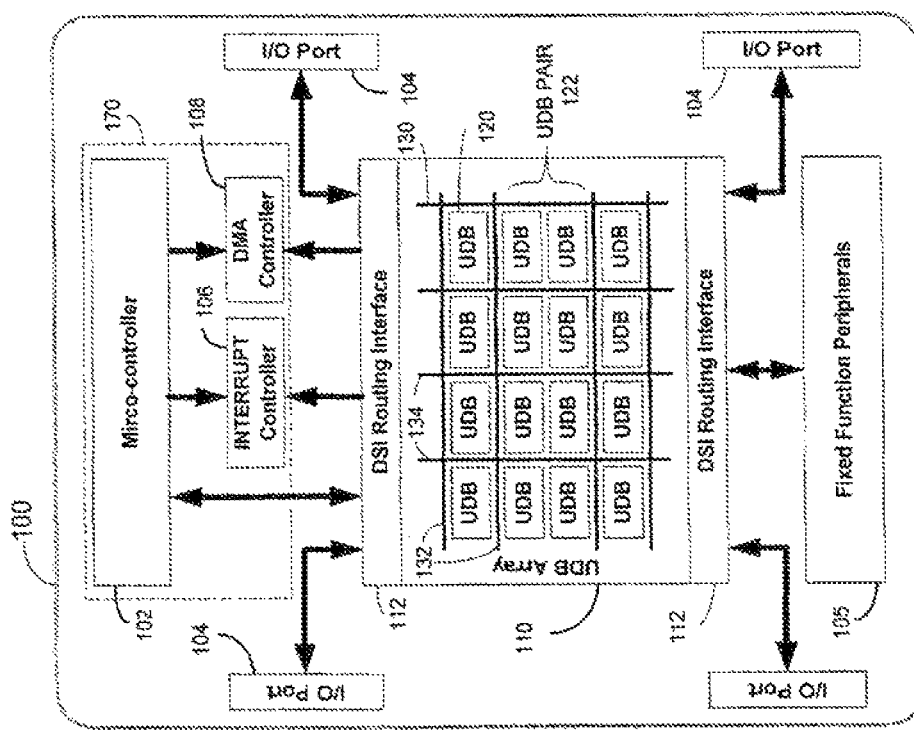
FIG. 1 is a schematic block diagram illustrating an example PSoC architecture that includes a Universal Digital Block (UDB) array.

FIG. 1 is a high level view of a Universal Digital Block (UDB) array 110 contained within a Programmable System on a Chip (PSoC) Integrated Circuit (IC) 100. The UDB array 110 includes a programmable interconnect matrix 130 that connects together the different UDBs 120. The individual UDBs 120 each include a collection of uncommitted logic in the form of Programmable Logic Devices (PLDs) and structural dedicated logic elements that form a datapath 210 shown in more detail in FIGS. 8 and 9.

UDB Array

The UDB array 110 is arranged into UDB pairs 122 that each include two UDBs 120 that can be tightly coupled to a shared horizontal routing channel 132. The UDB pairs 122 can also be programmably connected to the horizontal routing channels 132 of other UDB pairs 122 either in the same horizontal row or in different rows through vertical routing channels 134. The horizontal and vertical routing channels and other switching elements are all collectively referred to as the interconnect matrix 130.

A Digital System Interconnect (DSI) routing interface 112 connects a micro-controller system 170 and other fixed function peripherals 105 to the UDB array 110. The micro-controller system 170 includes a micro-controller 102, an interrupt controller 106, and a Direct Memory Access (DMA) controller 108. The other peripherals 105 can be any digital or analog functional element in PSoC 100. The DSI 112 is an extension of the interconnect matrix 130 at the top and bottom of the UDB array 110.

Figure 2:
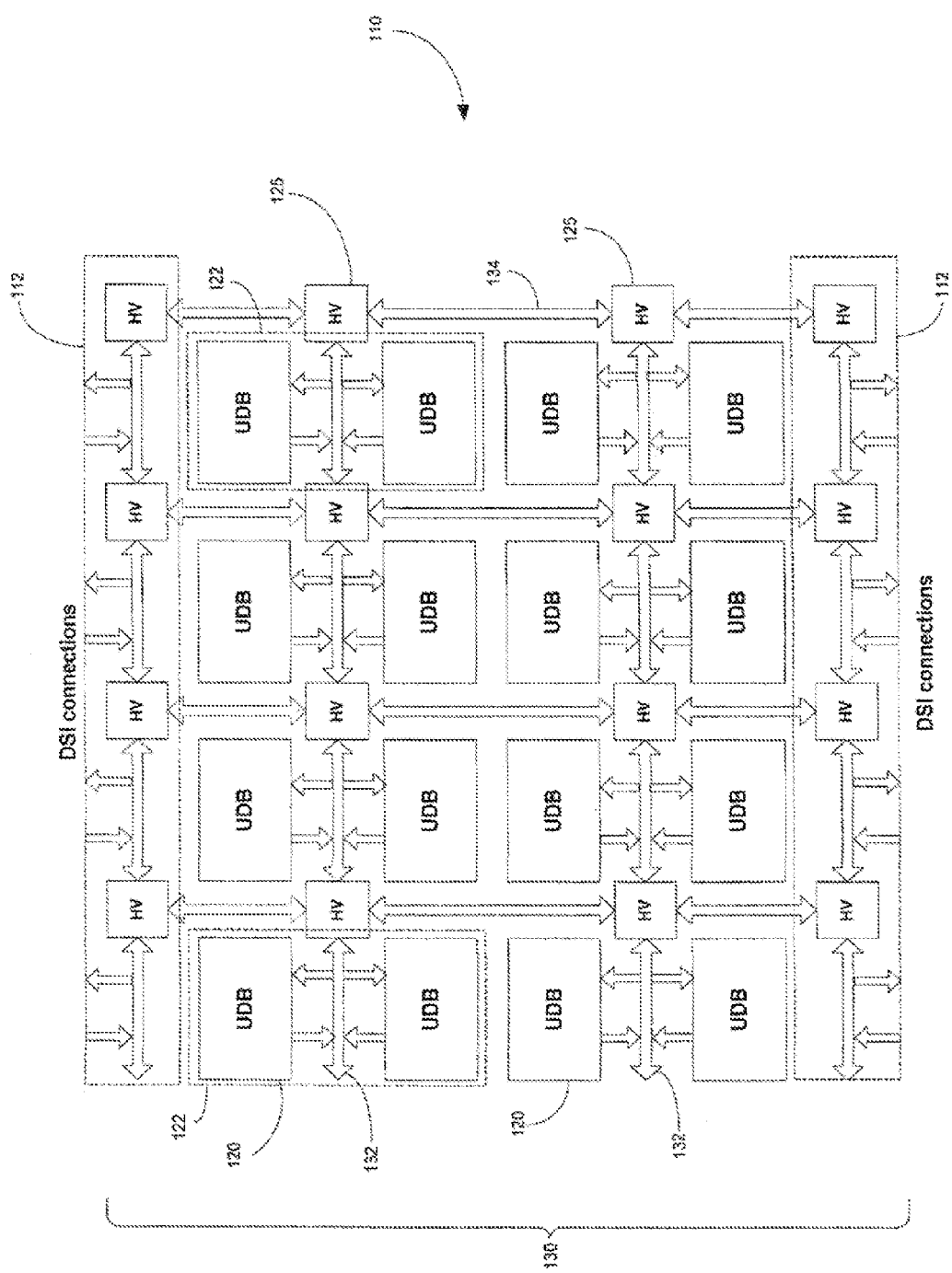
FIG. 2 is a schematic block showing an interconnect matrix in the UDB array.

FIG. 2 shows the interconnect matrix 130 in more detail and includes horizontal routing channels 132 that programmably connect with one or more associated Universal Digital Blocks (UDB) 120. In this example, pairs 122 of UDBs 120 are tightly coupled together through their associated horizontal routing channel 132. However, more than two UDBs 120 can be tightly coupled together through the same horizontal routing channel 132.

The interconnect matrix 130 also includes Horizontal/Vertical (H/V) segmentation elements 125 that programmably interconnect the different horizontal routing channels 132 together. The segmentation elements 125 couple together the horizontal routing channels 132 for the different digital block pairs 122 in the same rows. The segmentation elements 125 also programmably couple together the horizontal routing channels 132 for digital block pairs 122 in different rows through vertical routing channels 134.

Figure 3:
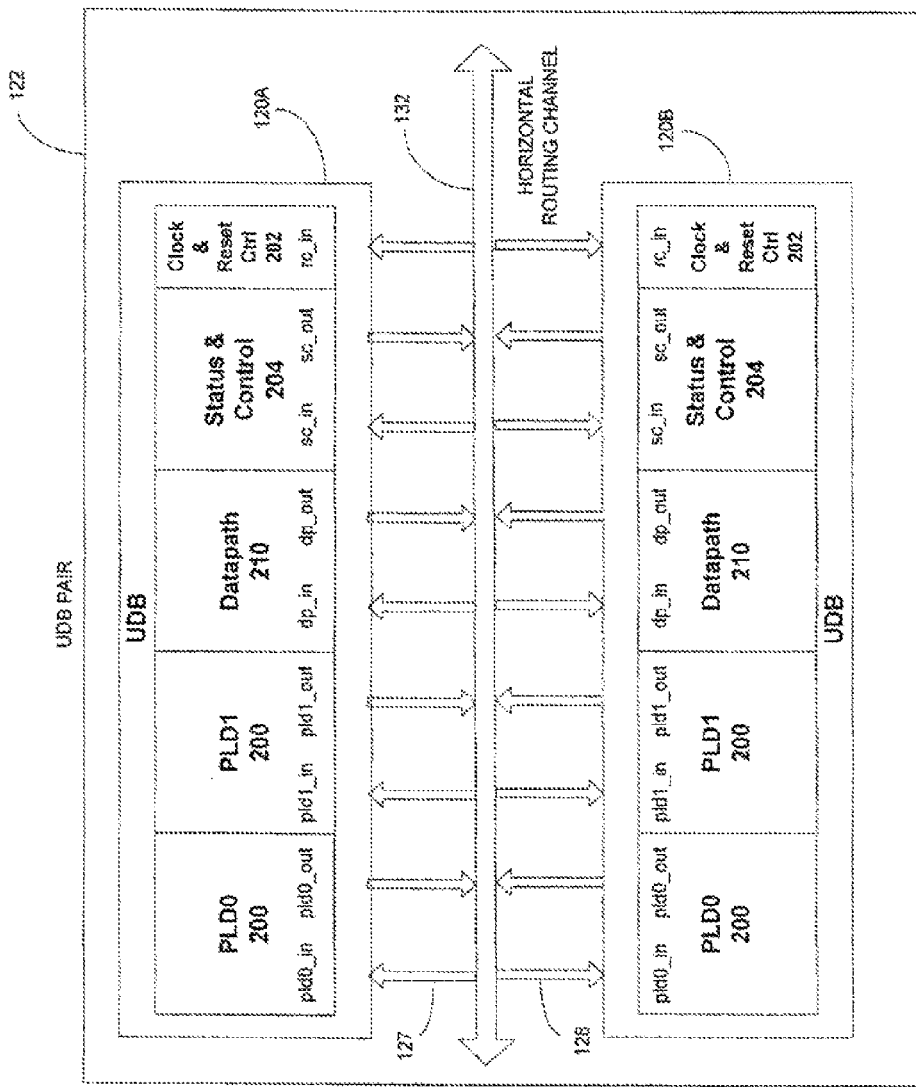
FIG. 3 is a schematic block diagram showing how a pair of UDBs are tightly coupled to a horizontal routing channel.

FIG. 3 shows one of the UDB pairs 122 in more detail. The UDBs 120A and 120B each contain several different functional blocks that in one embodiment include two Programmable Logic Devices (PLDs) 200, a data path 210, status and control 204, and clock and reset control 202. The operations of these different functional elements are described in more detail below in FIGS. 8 and 9.

The two UDBs 120A and 120B in UDB pair 122 are tightly coupled together to common routes in the same associated horizontal routing channel 132. Tight coupling refers to the UDB I/O signals 127 in the upper UDB 120A and the corresponding signals 128 in the lower UDB 120B all being directly connected to the same associated horizontal routing channel 132. This tight coupling provides high performance signaling between the two UDBs 120A and 120B. For example, relatively short connections 127 and 128 can be programmably established between the upper UDB 120A and the lower UDB 120B.

In one embodiment, the horizontal routing channels 132 can also have a larger number of routes and connections to the UDBs 120A and 120B than the vertical routing channels 134 shown in FIG. 2. This allows the horizontal routing channels 132 to provide more interconnectivity both between the UDBs 120A and 120B in UDB pair 122 and also provides more interconnectivity between different UDB pairs 122 in the same rows of interconnect matrix 130.

Thus, the interconnect matrix 130 in FIGS. 1 and 2 more effectively uses chip space by providing more traces and connectivity for the shorter/higher performance horizontal routing channels 132 than the relatively longer/lower performance vertical routing channels 134.

Figure 4:
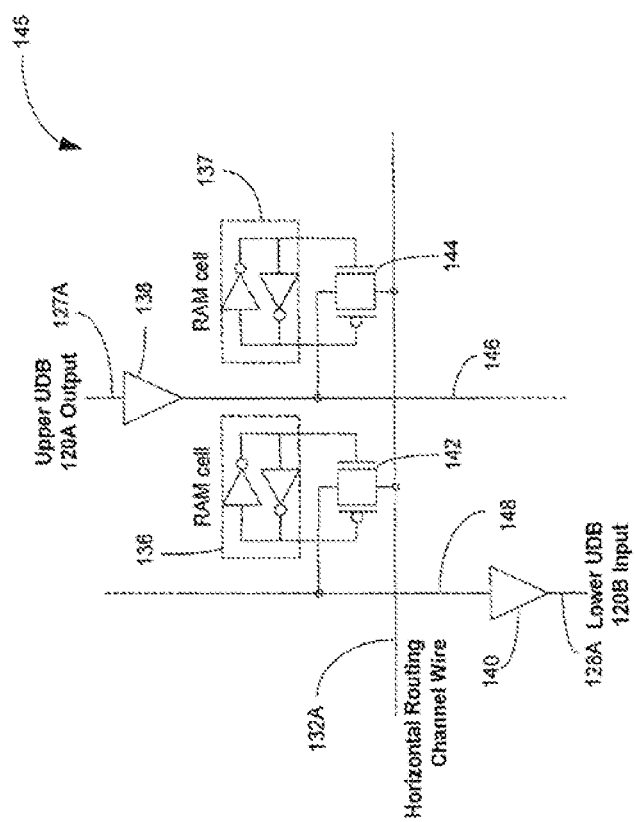
FIG. 4 is a schematic block diagram showing programmable switches that connect the UDBs in FIG. 3 to the horizontal routing channel.

FIG. 4 shows switching elements 145 that connect the different I/O signals 127 and 128 for the UDBs 120A and 120B in FIG. 3 to the horizontal routing channel 132. In this example, an output 127A from the upper UDB 120A in the UDB pair 122 drives an input 128A in the lower UDB 120B. A buffer 138 is connected to the UDB output 127A and a buffer 140 is connected to the UDB input 128A. The output 127A and input 128A are connected to vertical wires 146 and 148, respectively, that intersect the horizontal routing channel wire 132A with a regular pattern.

At the switch points, RAM bits operate RAM cells 136 and 138 which in turn control Complementary Metal Oxide Semiconductor (CMOS) transmission gate switches 142 and 144, respectively. The switches 142 and 144 when activated connect the UDB output 127A and the UDB input 128A to horizontal routing channel wire 132A.

Figure 7:
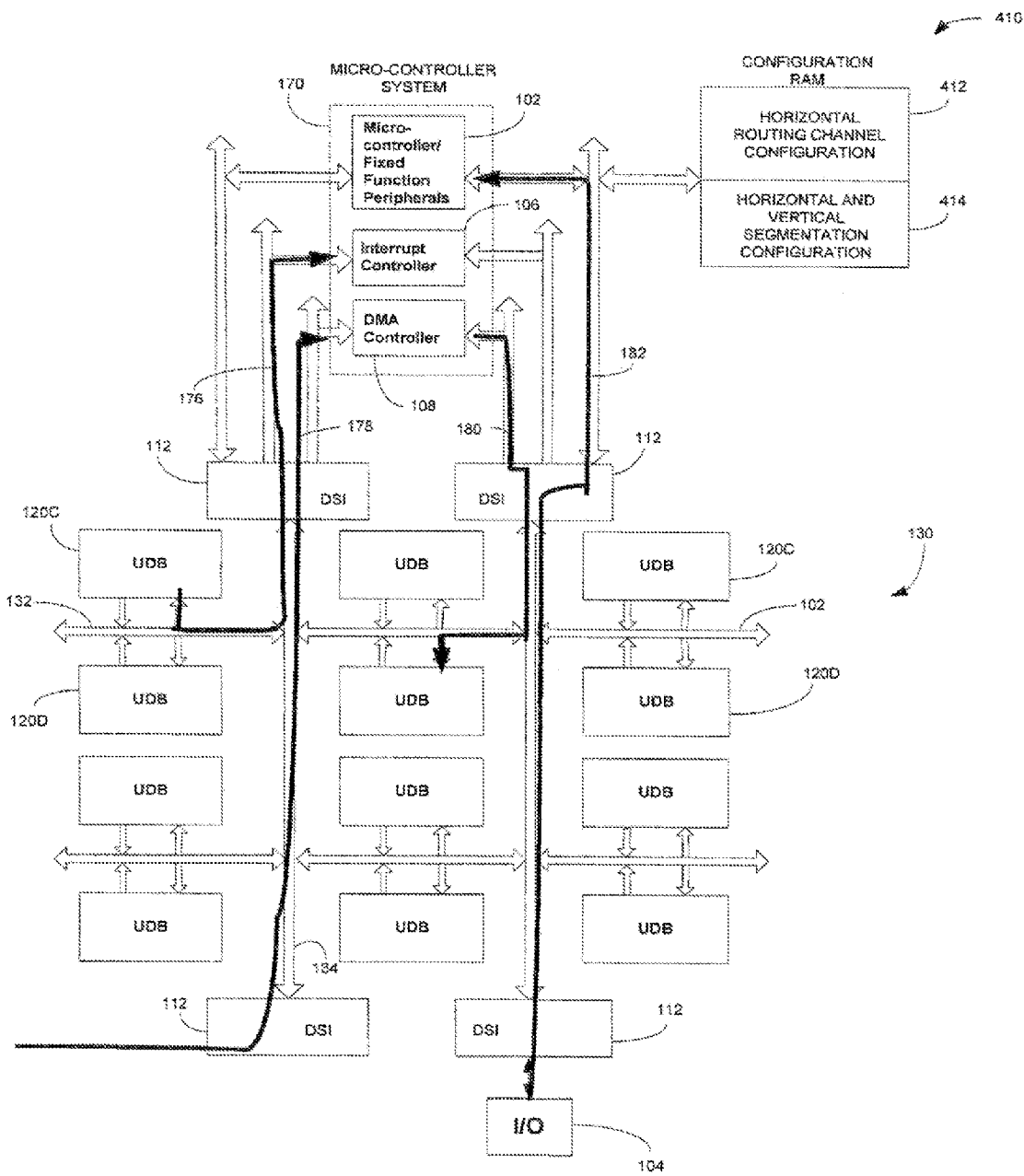
FIG. 7 is a schematic block diagram that shows how the interconnect matrix of FIG. 2 can connect different interconnect paths to a micro-controller system.

The RAM cells 136 and 137 are programmably selectable by the micro-controller 102 (FIG. 1) by writing values into a configuration RAM 410 (FIG. 7). This allows the micro-controller 102 to selectively activate or deactivate any of the gate switches 142 and 144 and connect any I/O 127 or 128 from either of the two universal digital blocks 120A and 120B to different wires in the horizontal channel 132.

Figure 5:
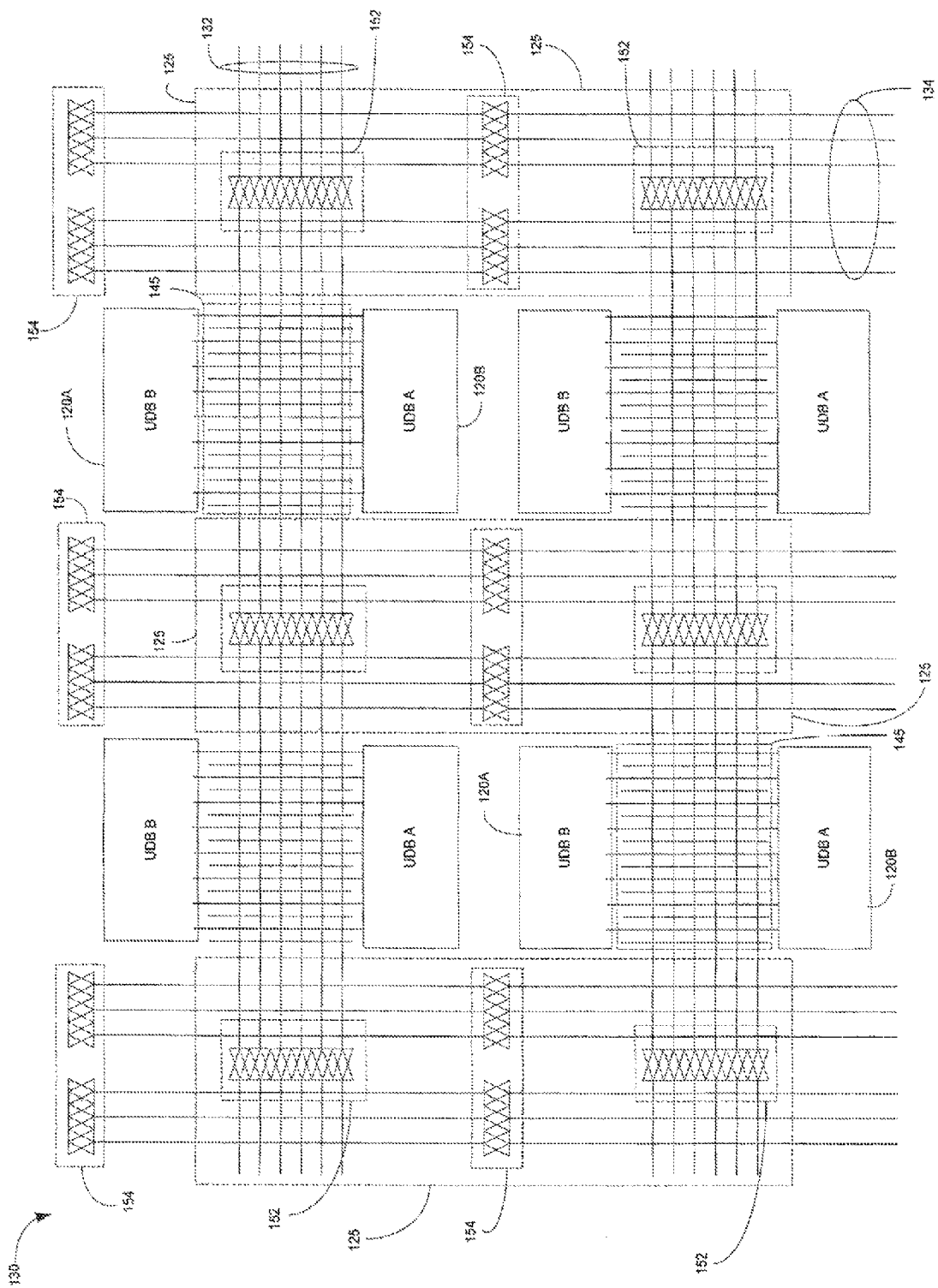
FIG. 5 is a schematic block diagram showing segmentation elements in the interconnect matrix.

FIG. 5 shows the interconnect matrix 130 previously shown in FIGS. 1 and 2 in further detail. The segmentation elements 125 can include different combinations of horizontal segmentation switches 152 and vertical segmentation switches 154. The horizontal segmentation switches 152 programmably couple together adjacent horizontal routing channels 132 located in the same row. The vertical segmentation switches 152 programmably couple together horizontal routing channels 132 located vertically in adjacent rows via vertical routing channels 134.

In addition to the segmentation elements 125, the interconnect matrix 130 includes the switching elements 145 previously shown in FIG. 4 that programmably connect the upper and lower UDBs 120A and 120B with their associated horizontal routing channels 132.

Figure 6:
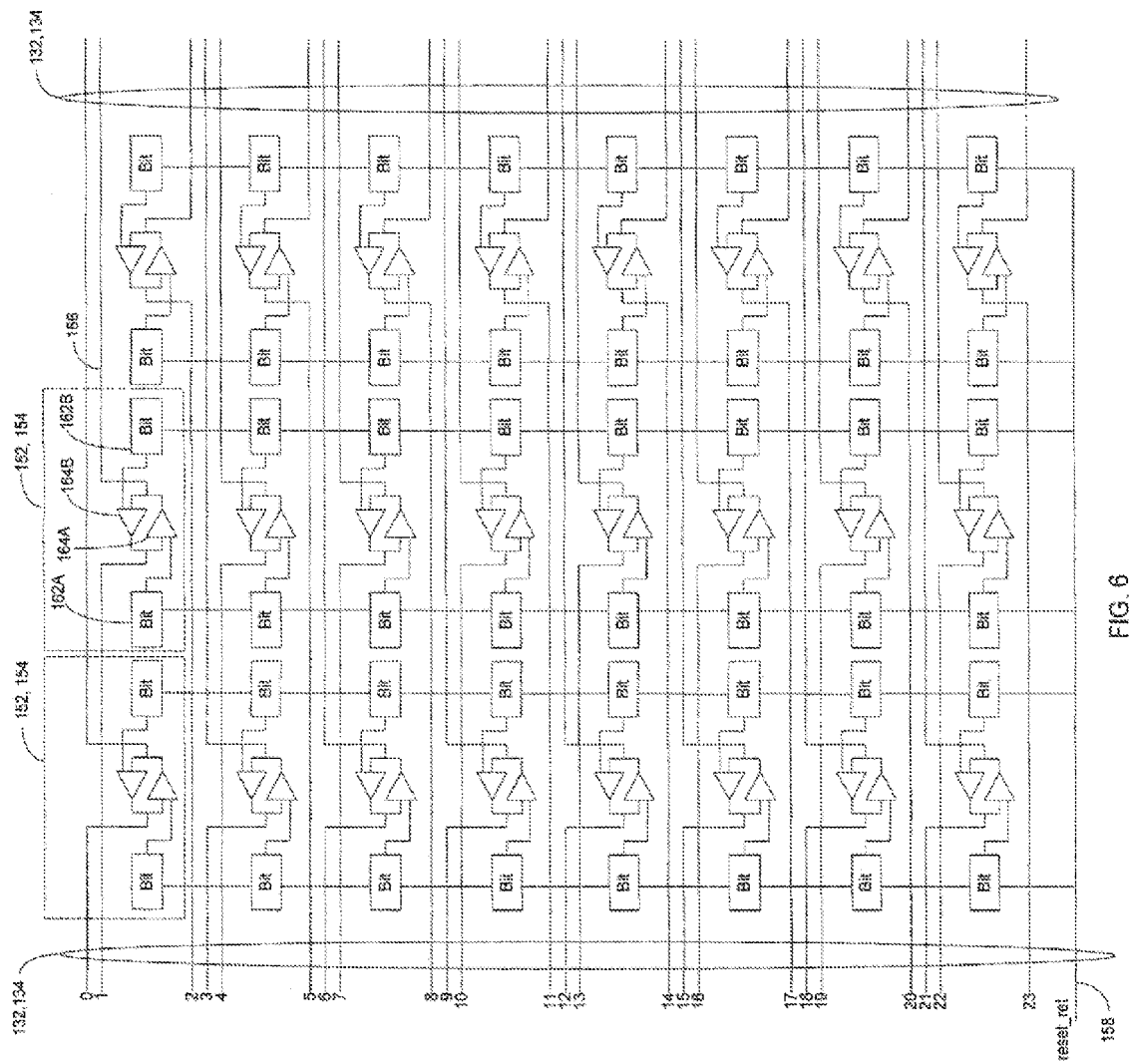
FIG. 6 is a schematic block diagram showing different programmable switches in the segmentation elements of FIG. 5 in more detail.

Referring to FIGS. 5 and 6, the segmentation elements 125 comprise arrays of horizontal segmentation switches 152 that are coupled in-between different horizontal routing channels 132 and vertical segmentation switches 154 coupled in-between the vertical routing channels 134. Each segmentation switch 152 and 154 is controlled by two bits 162A and 162B from the configuration RAM 410 (FIG. 7). The two bits 162A and 162B together control a tri-state buffer 164.

When bit 162A is set, the buffer 164A drives one of the horizontal or vertical channel lines 166 from left to right. When bit 162B is set, the buffer 164B drives the same horizontal or vertical channel line 166 from right to left. If neither bit 162A or bit 162B is set, the buffers 164A and 164B drive line 166 to a high impedance state.

Configuration and Programmability

Any combination of the switching elements 145, horizontal segmentation switches 152, and vertical segmentation switches 154 can be programmably configured to connect together almost any combination of external I/O pins 104 (FIG. 1), UDBs 120, and micro-controller system elements 170, fixed peripherals 105, and UDBs 120 (FIG. 1).

FIG. 7 shows different examples of how different types of interconnect paths can be programmed through the interconnect matrix 130. A Random Access Memory (RAM) or a set of configuration registers 410 are directly readable and writeable by the micro-controller 102. The configuration registers 410 are shown as a stand-alone RAM in FIG. 7 for illustrative purposes. However, it should be understood that certain configuration registers 410 can be located within the individual UDBs 120 while other configuration registers can be stand-alone registers that are accessed by multiple different functional elements.

A first set of bits in RAM section 412 are associated with the RAM cells 136 and 137 shown in FIG. 4 that control connections between the inputs and output of UDB and their associated horizontal routing channels 132. A second set of bits in RAM section 414 control how the horizontal segmentation switches 152 in FIGS. 5 and 6 connect the horizontal routing channels 132 in the same rows together and other bits in RAM section 414 control how the vertical segmentation switches 154 connect together the horizontal routing channels 132 in different rows.

Pursuant to the micro-controller 102 programming RAM 410, the interconnect matrix 130 is configured with a first interconnect path 176 that connects a UDB 120C to the interrupt controller 106. The UDB 120O can then send interrupt requests to the DMA controller 108 over interconnect path 176. A second interconnect path 178 is established between a peripheral (not shown) in the PSoC chip 100 (FIG. 1) and the DMA controller 108. The peripheral sends DMA requests to the DMA controller 108 over the interconnect path 178 established over the interconnect matrix 130.

A third interconnect path 180 is also configured by the micro-controller 102 by loading bits into RAM sections 412 and 414. The DMA controller 108 uses the interconnect path 180 to send a DMA terminate signal to UDB 120D. A fourth interconnect path 182 is programmably configured between one of the PSoC I/O pins 104 and a fixed digital peripheral, such as the micro-controller 102. The interconnect path 182 is used to send I/O signals between the micro-controller 102 and the I/O pin 104.

Interconnect paths 176-182 are of course just a few examples of the many different interconnect configurations that can be simultaneously provided by the interconnect matrix 130. This example also shows how different I/O pins 104, UDBs 120, and other peripherals can be connected to the same interrupt line on the interrupt controller 106 or connected to the same DMA line on the DMA controller 108.

Typically, interrupt requests received by an interrupt controller and DMA requests received by a DMA controller can only be connected to one dedicated pin. The interconnect matrix 130 allows any variety of different selectable functional elements or I/O pins to be connected to the same input or output for the interrupt controller 106 or DMA controller 108 according to the programming of RAM 410 by micro-controller 102.

The programmability of the interconnect matrix 130 also allows any number, or all, of the I/O pins 104 to be undedicated and completely programmable to connect to any functional element in PSoC 100. For example, the pin 104 can operate as an input pin for any selectable functional element in FIG. 7. In another interconnect matrix configuration, the same pin 104 can operate as an output pin when connected to a first peripheral and operate as an output pin when connected to a different peripheral.

Universal Digital Block

Figure 8:
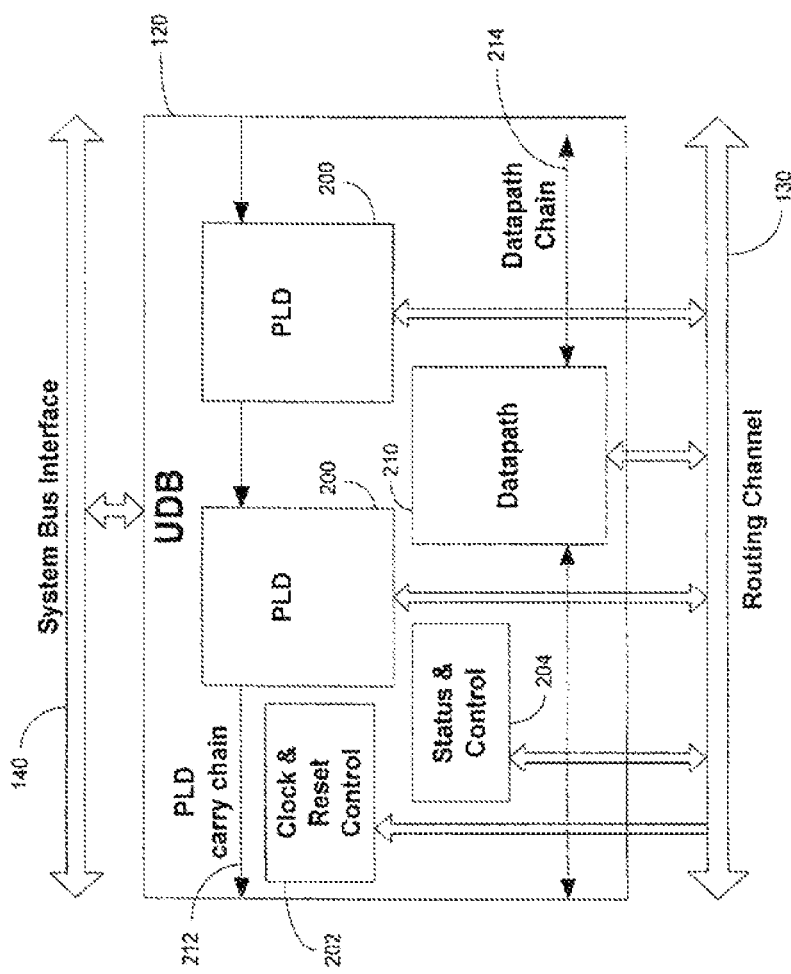
FIG. 8 is a schematic diagram that shows one of the UDBs in more detail.

FIG. 8 is a top-level block diagram for one of the UDBs 120. The major blocks include a pair of Programmable Logic Devices (PLDs) 200. The PLDs 200 take inputs from the routing channel 130 and form registered or combinational sum-of-products logic to implement state machines, control for datapath operations, conditioning inputs and driving outputs.

The PLD blocks 200 implement state machines, perform input or output data conditioning, and create look-up tables. The PLDs 200 can also be configured to perform arithmetic functions, sequence datapath 210, and generate status. PLDs are generally known to those skilled in the art and are therefore not described in further detail.

The datapath block 210 contains highly structured dedicated logic that implements a dynamically programmable ALU, comparators, and condition generation. A status and control block 204 allows micro-controller firmware to interact and synchronize with the UDB 120 by writing to control inputs and reading status outputs.

A clock and reset control block 202 provides global clock selection, enabling, and reset selection. The clock and reset block 202 selects a clock for each of the PLD blocks 200, the datapath block 210, and status and control block 204 from available global system clocks or a bus clock. The clock and reset block 202 also supplies dynamic and firmware resets to the UDBs 120.

Routing channel 130 connects to UDB 110 through a programmable switch matrix and provides connections between the different UDBs in FIG. 7. A system bus interface 140 maps all registers and RAMs in the UDBs 120 into a system address space and are accessible by the micro-controller 102.

The PLDs 200 and the datapath 210 have chaining signals 212 and 214, respectively, that enable neighboring UDBs 120 to be linked to create higher precision functions. The PLD carry chain signals 212 are routed from the previous adjacent. UDB 120 in the chain, and routed through each macrocell in both of the PLDs 200. The carry out is then routed to the next UDB 120 in the chain. A similar connectivity is provided by the datapath chain 214 between datapath blocks 210 in adjacent UDBs 120.

Figure 9:
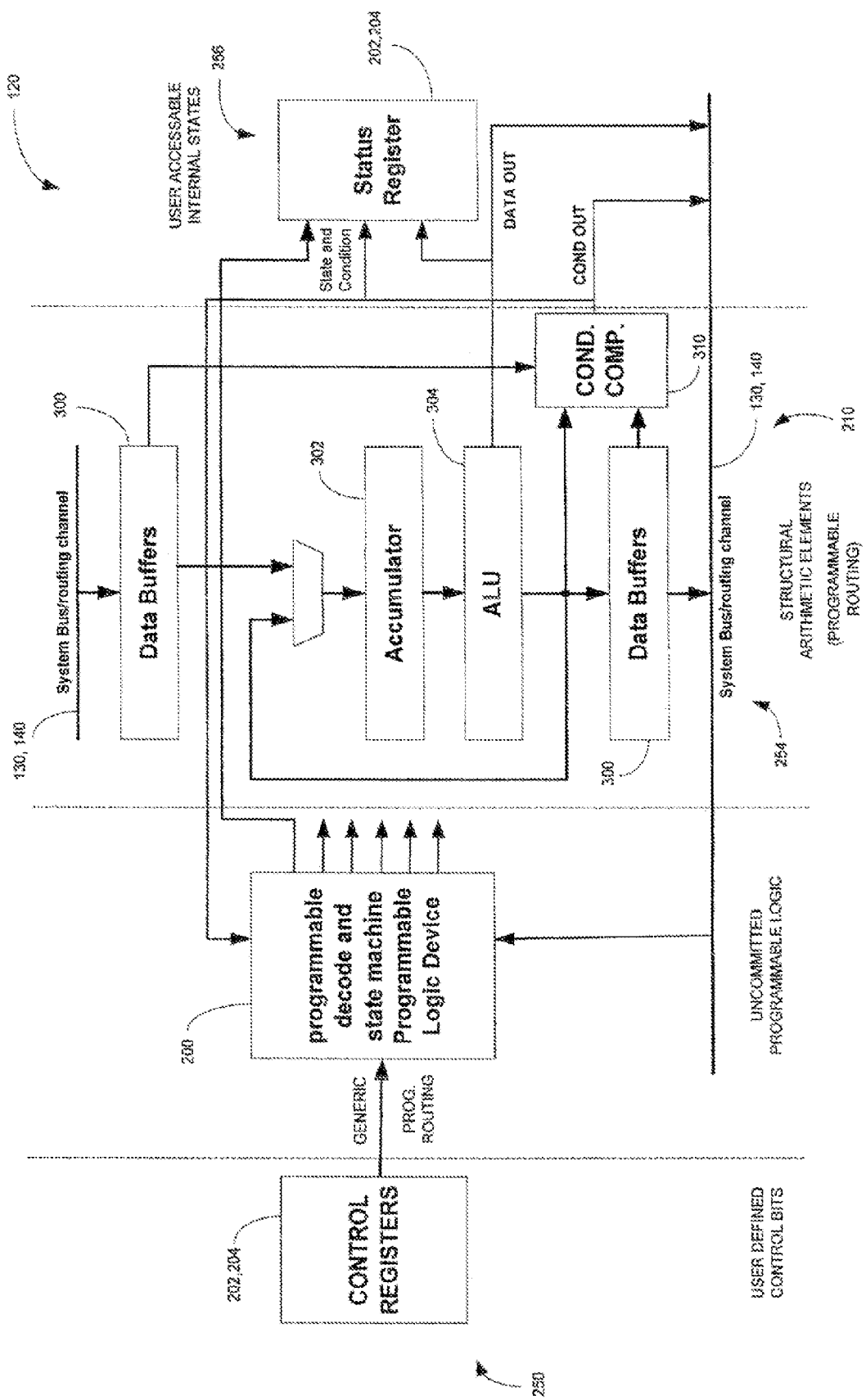
FIG. 9 is a schematic diagram that shows a datapath in the UDB of FIG. 8 in more detail.

Referring to FIG. 9, each UDB 120 comprises a combination of user defined control bits that are loaded by the micro-controller 102 into control registers 250. The control registers 250 can be part of the control blocks 202 and 204 described above in FIG. 8. The control registers 250 feed uncommitted programmable logic 200. The same control blocks 202 and 204 described above in FIG. 8 also include associated status registers 256 that allow the micro-controller 102 to selectably read different internal states for structural arithmetic elements 254 within the datapath 210.

The datapath 210 comprises highly structured logic elements 254 that include a dynamically programmable ALU 304, conditional comparators 310, accumulators 302, and data buffers 300. The ALU 304 is configured to perform instructions on accumulators 302, and to update the sequence controlled by a sequence memory. The conditional comparators 310 can operate in parallel with the ALU 304. The datapath 210 is further optimized to implement typical embedded functions, such as timers, counters, etc.

The combination of uncommitted PLDs 200 with a dedicated datapath module 210 allow the UDBs 120 to provide embedded digital functions with more efficient higher speed processing. The dedicated structural arithmetic elements 254 more efficiently implement arithmetic sequencer operations, as well as other datapath functions. Since the datapath 210 is structural, fewer gates are needed to implement the structural elements 254 and fewer interconnections are needed to connect the structural elements 254 together into an arithmetic sequencer. Implementing the same datapath 210 with PLDs could require additional combinational logic and additional interconnections.

The structured logic in the datapath 210 is also highly programmable to provide a wide variety of different dynamically selectable arithmetic functions. Thus, the datapath 210 not only conserves space on the integrated circuit 100 (FIG. 1) but also is more accessible and programmable than other structured arithmetic sequencers.

The functional configurability of the datapath 210 is provided through the control registers 250 and allow the micro-controller 102 to arbitrarily write into a system state and selectively control different arithmetic functions. The status registers 256 allow the micro-controller 102 to also identify different states associated with different configured arithmetic operations.

The flexible connectivity scheme provided by the routing channel 130 selectively interconnects the different functional element 250, 200, 254, and 256 together as well as programmably connecting these functional element to other UDBs, I/O connections, and peripherals. Thus, the combination of uncommitted logic 200, structural logic 254, and programmable routing channel 130 provides more functionality, flexibility, and more efficiently uses less integrated circuit space.

The interconnect matrix 130 also requires little or no dedicated UDB block routing. All data, state, control, signaling, etc, can be routed through the interconnect matrix 130 in the UDB array 110. The array routing is efficient because there is little or no difference between a local UDB net and a net that spans the UDB array. Horizontal and vertical segmentation allow the array to be partitioned for increased efficiency and random access to the RAM 410 allow high speed configuration or on the fly reconfiguability.

The system described above can use dedicated processor systems, micro controllers, programmable logic devices, or microprocessors that perform some or all of the operations. Some of the operations described above can be implemented in software and other operations can be implemented in hardware.

For the sake or convenience, the operations are described as various interconnected functional blocks or distinct software modules. This is not necessary, however, and there can be cases where these functional blocks or modules are equivalently aggregated into a single logic device, program or operation with unclear boundaries. In any event, the functional blocks and software modules or features of the flexible interface can be implemented by themselves, or in combination with other operations in either hardware or software.

Having described and illustrated the principles of the invention in a preferred embodiment thereof, it should be apparent that the invention can be modified in arrangement and detail without departing from such principles. Claim is made to all modifications and variation coming within the spirit and scope of the following claims.

The invention claimed is:

1. An apparatus, comprising:
a plurality of digital blocks arranged into one or more pairs;
a programmable interconnect matrix including a first set of routing channels that programmably couple at least the two digital blocks of the one or more pairs together and segmentation elements that programmably interconnect two or more of the first set of routing channels together; and
a micro-controller system programmably coupled to the plurality of digital blocks and to one or more Inputs/Outputs (I/Os) through the programmable interconnect matrix.

2. The apparatus of claim 1, wherein at least one of the plurality of digital blocks is a programmable digital block.

3. The apparatus of claim 1, wherein the micro-controller system comprises:
a micro-controller coupled to the programmable interconnect matrix; and
a Direct Memory Access (DMA) controller coupled to the programmable interconnect matrix.

4. The apparatus of claim 3, wherein the micro-controller system, the plurality of digital blocks, the one or more I/Os, and the programmable interconnect matrix are all located in a same integrated circuit.

5. The apparatus of claim 1, wherein the micro-controller system comprises:
a micro-controller coupled to the programmable interconnect matrix; and
an interrupt controller coupled to the programmable interconnect matrix.

6. The apparatus of claim 5, wherein the micro-controller system, the plurality of digital blocks, the one or more I/Os, and the programmable interconnect matrix are all located in a same integrated circuit.

7. The apparatus of claim 1, further comprising a configuration memory coupled to the micro-controller system.

8. The apparatus of claim 1, further comprising a memory device accessible by the micro-controller system to control how the one or more of the plurality of digital blocks connect to the first set of routing channels.

9. The apparatus of claim 8, wherein the memory device is accessible by the micro-controller system to control how the first set of routing channels connect to the segmentation elements.

10. The apparatus of claim 1, wherein the segmentation elements comprises:
horizontal segmentation switches that programmably couple together the first set of routing channels in a same row; and
vertical segmentation switches that programmably couple together the first set of routing channels in one or more rows through a second set of routing channels.

11. The apparatus of claim 1, further comprising:
programmably selectable channel switches configured to connect one or more selectable signals from the plurality of digital bocks to associated ones of the first set of routing channels; and programmable tri-state buffers in the segmentation elements configured to selectively couple together and drive signals between the associated ones of the first set of routing channels.

12. A method, comprising:

programming an interconnect matrix to connect two or more functional elements to a first set of routing channels, wherein the two or more functional elements are arranged into one or more pairs, the pairs being coupled together through one or more of the first set of routing channels;

programming the interconnect matrix to interconnect two or more of the first set of routing channels together;

writing, by a micro-controller system, a first set of values into a configuration memory that control connections between the two or more functional elements and the first set of routing channels.

13. The method of claim 12, further comprising:

writing, by the micro-controller system, a second set of values into the configuration memory that control the interconnections between the two or more of the first set of routing channels; and writing, by the micro-controller system, a third set of values into the configuration memory that control the interconnections between the first set of routing channels and a second set of routing channels.

14. The method of claim 13, further comprising programming the interconnect matrix to further connect the two or more of the first set of routing channels to each other through the second set of routing channels.

15. The method of claim 12, wherein the one or more functional elements comprises one or more programmable digital blocks.

16. The method of claim 12, further comprising programming one or more paths through the interconnect matrix that connect one or more external pins or one or more internal functional elements to a same interrupt line on an internal interrupt controller.

17. The method of claim 12, further comprising programming one or more paths through the interconnect matrix that connect one or more external pins or one or more internal functional elements to a same Direct Memory Access (DMA) line on an internal DMA controller.

18. An apparatus, comprising:

a plurality of digital blocks arranged into one or more pairs;

a programmable interconnect matrix including a first set of routing channels that programmably couple at least the two digital blocks of the one or more pairs together and segmentation elements that programmably interconnect two or more of the first set of routing channels together; and a micro-controller system programmably coupled to the plurality of digital blocks, to at least one Input/Output (I/O), and a fixed function peripheral through the programmable interconnect matrix.

19. The apparatus of claim 18, wherein the micro-controller system comprises:

a micro-controller coupled to the programmable interconnect matrix; and a Direct Memory Access (DMA) controller coupled to the programmable interconnect matrix.

20. The apparatus of claim 19, wherein the micro-controller system, the plurality of digital blocks, the I/O port, and the programmable interconnect matrix are all located in a same integrated circuit.

21. The apparatus of claim 18, wherein the micro-controller system comprises:

a micro-controller coupled to the programmable interconnect matrix; and an interrupt controller coupled to the programmable interconnect matrix.

22. The apparatus of claim 21, wherein the micro-controller system, the plurality of digital blocks, the I/O port, and the programmable interconnect matrix are all located in a same integrated circuit.

* * * * *